United States Patent [19]

Pergande

[11] Patent Number: 4,811,426
[45] Date of Patent: Mar. 7, 1989

[54] SUSPENDED STRIPLINE RAT RACE MIXER WITH SIMPLIFIED I. F. EXTRACTION

[75] Inventor: Albert N. Pergande, Orlando, Fla.

[73] Assignee: Martin Marietta Corporation, Bethesda, Md.

[21] Appl. No.: 48,104

[22] Filed: May 7, 1987

[51] Int. Cl.⁴ .............................................. H04B 1/26
[52] U.S. Cl. ..................................... 455/327; 455/330
[58] Field of Search ............... 455/327, 326, 325, 328, 455/330

[56] References Cited

U.S. PATENT DOCUMENTS

| | | |
|---|---|---|
| 3,512,091 | 5/1970 | Blixt et al. ............................ 455/327 |
| 3,521,202 | 7/1970 | Russell . | |
| 3,619,787 | 11/1971 | Salzberg . | |
| 3,772,599 | 11/1973 | Ernst et al. ........................ 455/327 |
| 3,950,703 | 4/1976 | Reindel ................................ 455/327 |
| 4,008,438 | 2/1977 | Shinkawa et al. ................... 455/327 |
| 4,031,472 | 6/1977 | Shinkawa et al. ................... 455/327 |
| 4,249,263 | 2/1981 | Shinkawa et al. ................... 455/327 |
| 4,377,005 | 3/1983 | Marchand et al. .................. 455/327 |
| 4,420,839 | 12/1983 | Hogerheiden, Jr. ................ 455/327 |
| 4,461,040 | 7/1984 | Dobrovolny ....................... 455/327 |
| 4,491,977 | 1/1985 | Paul ..................................... 455/327 |
| 4,509,209 | 4/1985 | Itoh et al. ............................ 455/327 |
| 4,542,535 | 9/1985 | Bates et al. ........................... 455/327 |
| 4,603,437 | 7/1986 | Dydyk et al. ....................... 455/327 |

FOREIGN PATENT DOCUMENTS 3322559 3/1985 Fed. Rep. of Germany .
0171206 8/1986 Japan .................................... 455/327

*Primary Examiner*—Robert L. Griffin
*Assistant Examiner*—Ralph E. Smith
*Attorney, Agent, or Firm*—Julian C. Renfro

[57] ABSTRACT

This invention concerns suspended stripline having RF and LO inputs, in connection with which is used a novel rat race mixer (30). The rat race mixer is in the form of a ring (31) formed on a substrate (18), with the ring being entirely surrounded by a ground plane (24) located on the same side of the substrate (18) as the ring. Diode means (32 and 34) are utilized on the outer part of the ring (31), connecting the ring to the ground plane (24) at locations of RF and LO maxima. A high impedance lead (36) in the center of the ring (31) defines the location at which the IF is extracted, and in a preferred embodiment, a bellows (42) supported by the centerpost (40) of a coaxial bulkhead connector (46) is in contact with the high impedance lead (36).

3 Claims, 3 Drawing Sheets

SUSPENDED STRIPLINE RAT RACE MIXER WITH SIMPLIFIED I. F. EXTRACTION

TECHNICAL FIELD

This invention relates generally to hybrid junction mixers useful in the microwave and millimeter wave regions, and more particularly to a novel and particularly useful adaptation of a hybrid ring mixer (also known as "rat race mixer") device to the suspended stripline art.

BACKGROUND ART

Hybrid junction mixers are known to be extensively used in various microwave and millimeter wave balanced-circuit configurations, including balanced mixers single-sideband modulators, phase and amplitude monopulse comparators, frequency multiplexers, and constant impedance filters.

Several useful forms of hybrid junction mixers are well known, including the hybrid ring or "rat race," and each form is known to be able to be implemented in waveguide, coaxial line, or stripline media.

The basic hybrid ring comprises a closed loop transmission line essentially six quarter wavelengths in length. Four ports on the ring are spaced 60° apart geometrically, and one quarter wavelength apart electrically. For an ideal hybrid ring, a signal input to port 1 divides equally between ports 2 and 4 with a 180° phase difference, whereas a signal input to port 3 divides equally between the same ports 2 and 4 with a zero phase difference.

The prior art is replete with variations of the basic hybrid ring. One such prior art disclosure describing a hybrid ring as a mixer is contained in U.S. Pat. No. 4,031,472, the construction of which is said to avoid certain defects of the earlier devices.

The present invention differs from the prior art in several ways, one of which is that it relates to a millimeter wave suspended substrate mixer with a 180 degree hybrid, with a highly advantageous arrangement for extracting the intermediate frequency (IF.).

Others in endeavoring to deal with suspended stripline or other planar transmission lines have found it necessary to use a quarter wave stub for providing radio frequency and local oscillator ground, and this had the unfortunate characteristic of limiting bandwidth, and in addition requiring the use of jumper wires for extracting the I.F. signal.

For example, in a certain quartz suspended substrate circuit for radar applications, phase detectors and phase lock loop mixers were often found to occur in awkward and tight spaces. The I.F. had previously been extracted with a network of capacitors, resistors, and lines.

It was in an effort to overcome the disadvantages of these and other prior art techniques that the present invention was evolved.

DISCLOSURE OF INVENTION

The present invention involves a suspended stripline having thereon a rat race mixer in the form of a ring entirely surrounded by ground plane located on the same side of the substrate as the ring. Diode means are located on the outer part of the ring, connecting the ring to the ground plane at locations of RF and LO maxima. Novel means are utilized at the center of the ring, by which the IF generated in the ring is extracted, which means preferably takes the form of a high impedance lead with which a bellows is in contact. This bellows is typically supported by the center post of a coaxial bulkhead connector associated with the I.F. circuitry, at which location the extraction of the I.F. is accomplished. The ground plane surrounding the rat race is ground for all signals in the mixer, that is, for the I.F., the R.F., and the L.O.

As will be seen hereinafter, this invention enables the IF to be removed without any of the aforementioned complications, such as where the phase detectors or phase lock loop mixers occurred in awkward and tight spaces, and where it was previously necessary to extract the I.F. with a network of capacitors, resistors, and lines.

It is to be realized that there are other terms for the device I prefer to call a rat race mixer, these being hybrid mixer, hybrid coupler mixer, ring mixer, and 180° coupler mixer.

The suspended stripline ratrace mixer in accordance with this invention takes up less space than any known comparable prior art device, and may be located anywhere desired on the substrate.

It is therefore a primary object of my invention to provide a highly effective mixer used with suspended stripline, characterized by its compactness and low cost.

It is another object of my invention to provide a suspended stripline mixer that is compatible with planar RF circuitry, such that my mixer can be used with RF microcircuits on quartz, Gallium Arsenide, or the like.

It is still another object of this invention to make possible the extraction of I.F. perpendicularly of a suspended stripline substrate, thus saving room on the substrate, and minimizing the number of solder connections.

It is yet another object of my invention to provide a mixer for use with suspended stripline that provides a highly advantageous manner of extracting IF, without necessitating the use of a network of capacitors, resistors and lines.

It is yet still another object of my invention to provide a rat race mixer capable of being assembled by relatively unskilled labor, due to the straightforward assembly techniques that my advantageous new design makes readily possible.

It is yet still another object of my invention to provide a circuit highly suitable for millimeter wave applications, in that it requires minimal space on suspended stripline, and that can be placed at any of a number of possible locations on the substrate.

BEST MODE FOR CARRYING OUT THE INVENTION

Figure 1:
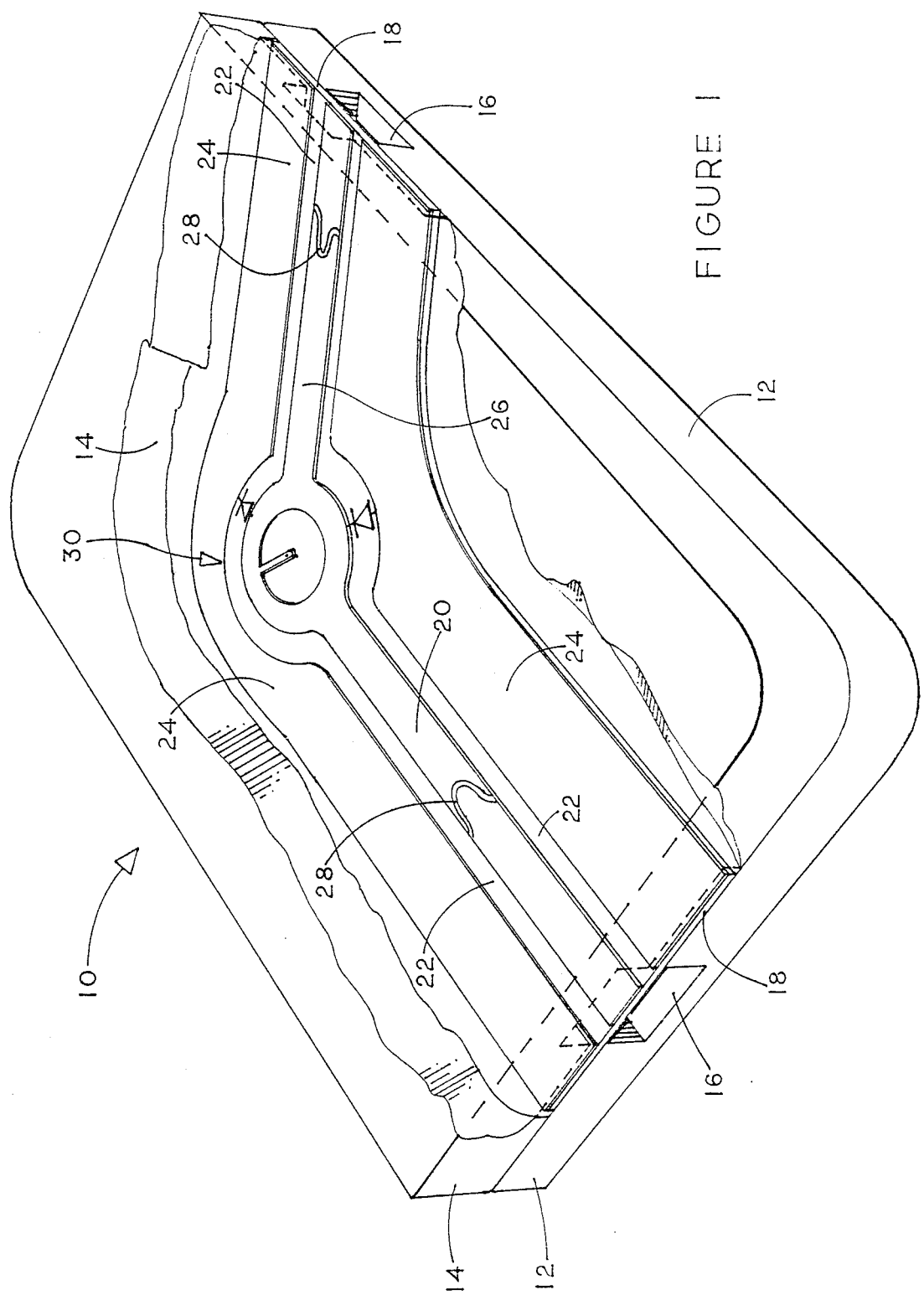
FIG. 1 is a perspective view of a typical suspended stripline rat race mixer in accordance with my invention, with parts of the upper housing being removed in order to reveal some of the significant internal construction.

In FIG. 1 is shown a typical section of suspended stripline 10, involving for example a lower housing member 12, and an upper housing member 14. These housing members may be made of metal, and each has an identically sized rectangular cutout formed therein, such that together these form a channel 16.

Figure 2:
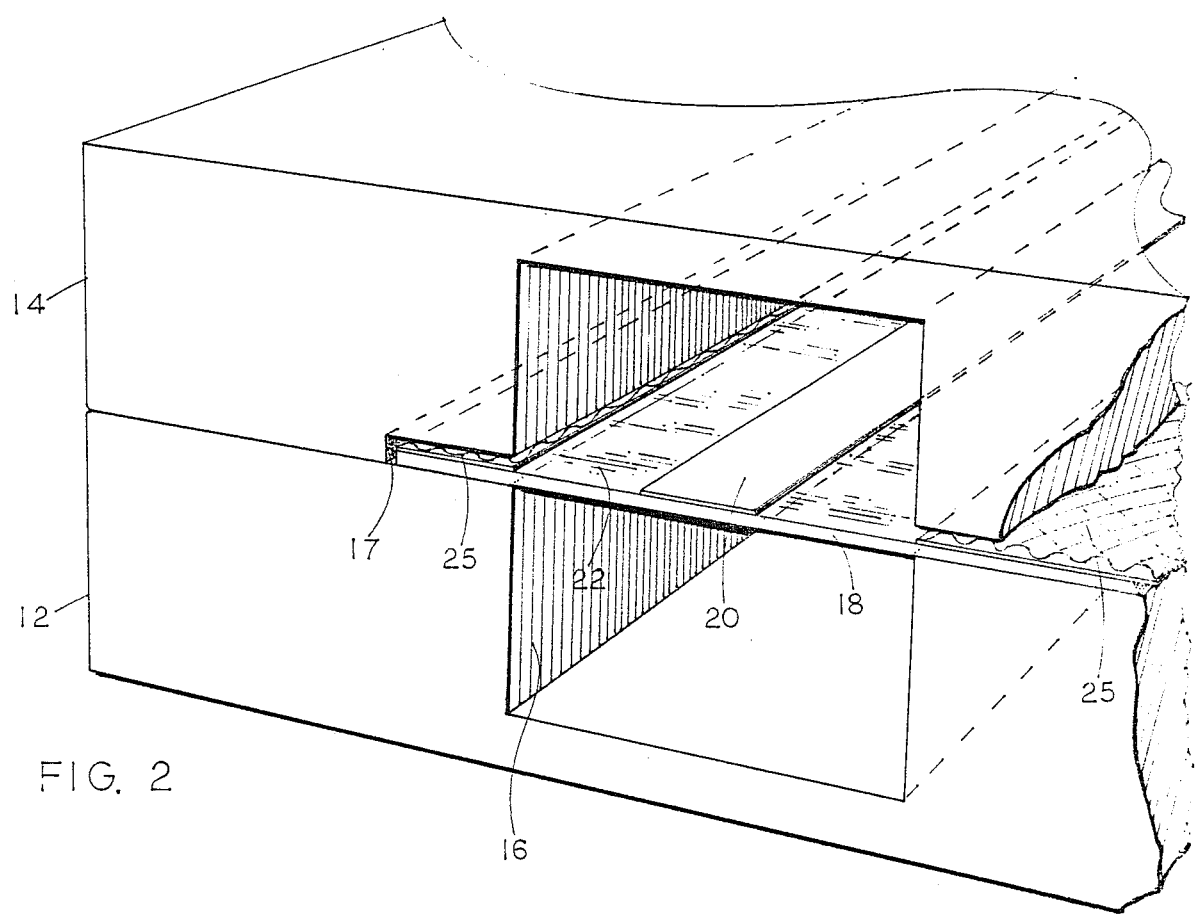
FIG. 2 is a view of an input portion of the device of FIG. 1, with a larger scale being used in order to reveal certain detail more clearly.

A hard dielectric 18 such as of a size 0.010" thick and 0.125" wide is utilized at the juncture of the two housing members, so as to create a suspended stripline member residing at the midpoint of the channel 16; note FIG. 2. I prefer the use of quartz as the material out of which the suspended stripline substrate is created. Quite obviously I am not to be limited to the use of quartz, nor am I to be limited to the foregoing dimensions. This type of construction used in the creation of suspended stripline is generally old in the art, and no invention is broadly claimed in the technique.

The upper housing 14 is cut away in FIG. 1 in order to make it possible to reveal that conductors 20 and 26 are formed along the upper surface of the hard dielectric member 18, preferably by the use of a very thin deposit of gold thereon, in a configuration consonant with the purpose to be served by the suspended stripline. The conductor 20 serves in this instance as the radio frequency (R.F.) input, whereas conductor 26 serves in this instance as the local oscillator (L.O.) input. A portion 22 of clear quartz resides on the upper surface of the quartz member, on the left and right sides of the conductors 20 and 26, and in the center of the rat race hybrid.

A ground plane 24 is formed on the same side of the hard dielectric 18 as the R.F. input 20 and the L.O. input 26, preferably by a thin deposit of gold on the surface of the quartz substrate. It will be noted from FIGS. 1 and 3 that the ground plane 24 exists both on the left and on the right of conductors 20 and 26, with the ground plane portions being separated from the conductors 20 and 26 by the portions 22 of clear quartz, as previously mentioned. It can thus be seen from FIGS. 1 and 2 that I have created a ground plane that entirely surrounds the rat race mixer 30 created in accordance with this invention, except at the input lines. Unlike the microstrip art where the ground plane is on the opposite side of the substrate from the conductor, in suspended stripline the ground plane 24 is created on the same side of the substrate as the conductors 20 and 26, as previously mentioned. As shown in FIGS. 2 and 4, a thin, corrugated metal shim 25 may be attached to the ground plane portions to facilitate the requisite electrical connection between the ground plane portions of the substrate, and the upper housing member 14, and also providing cushioning for the substrate which, in the case of quartz, is very fragile.

Figure 3:
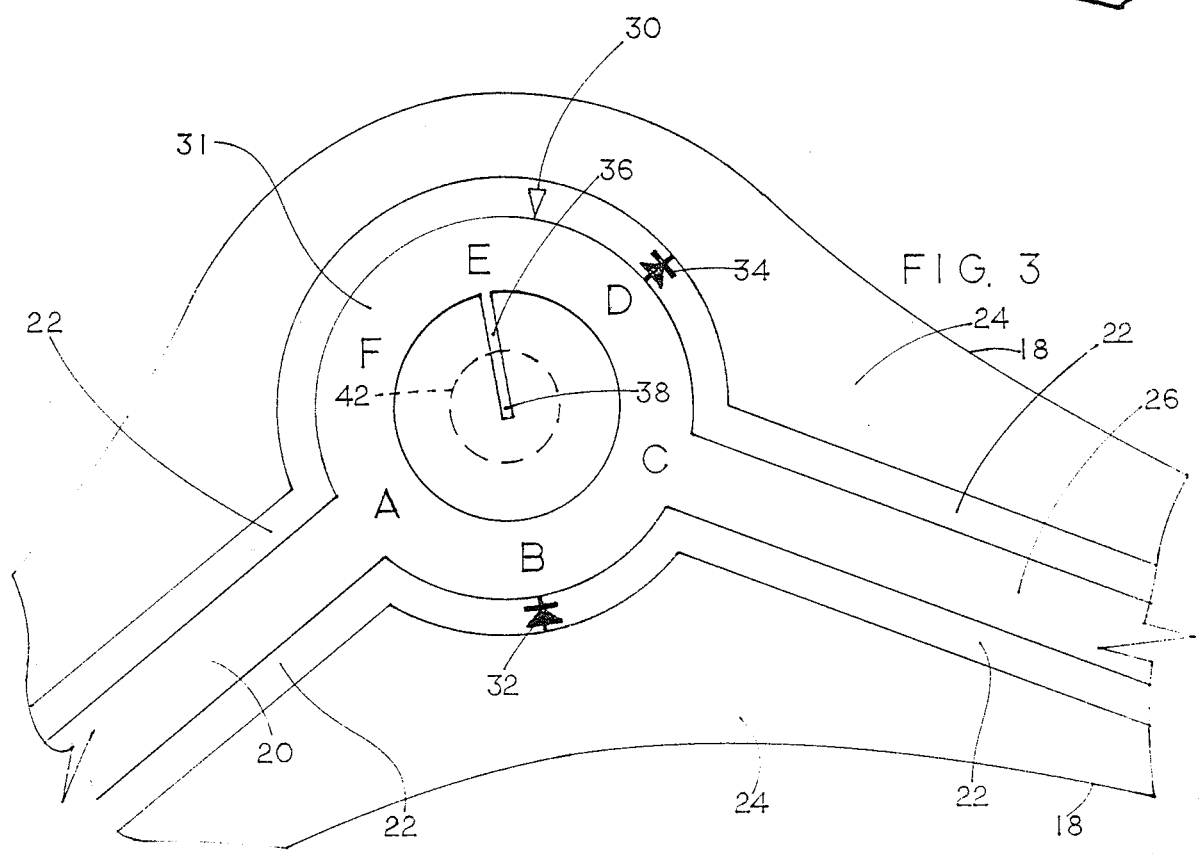
FIG. 3 is an enlarged plan view of the rat race portion of my device, with certain callouts being utilized in order to clarify polarities, and to reveal the location where the I.F. is extracted.
Figure 4:
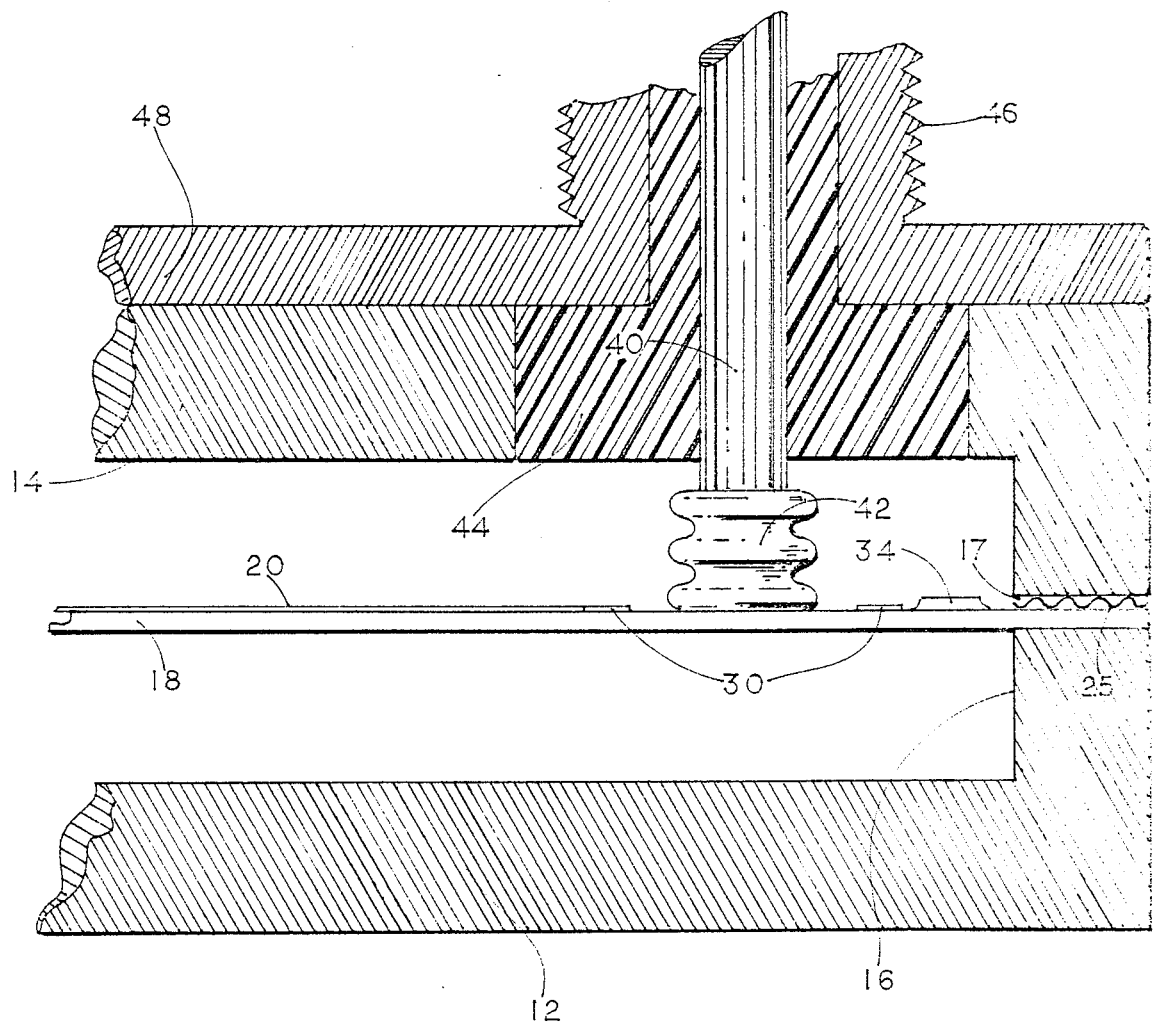
FIG. 4 is a cross-sectional view to a large scale, revealing the specific way that I.F. extraction is accomplished in accordance with a preferred embodiment of my invention.

In accordance with this invention, the rat race mixer 30 appearing in FIGS. 1 and 3 is built on suspended stripline. The rat race is a 180° hybrid, consisting of 1½ wavelengths of transmission line. If the inputs are of impedance Zo (typically 50 ohms), the ring is of impedance √2 Zo. These impedance relationships are well known in the prior art.

In FIG. 3, the points A through F on the ring portion 31 of the rat race mixer will be noted to be physically 60° apart, but these points are of course 90° apart electrically. The RF on conductor 20 is fed in at point A, and the RF signal travels both directions around the ring 31. It has a maximum magnitude at points B, D, and F, and a minimum at points C, E, and A. These minima and maxima are caused by the constructive and destructive interference of the waves traveling both in the clockwise and the counter-clockwise directions around the ring. Local oscillator (L.O.) is fed in by conductor 26 at C, an RF minima. The local oscillator then has maxima at points B, D, and F, and minima at points C, E, and A.

Both RF and LO present maxima at points B, D and F, and the mixer diodes I use may be utilized at any two of these points. In the embodiment illustrated in FIG. 3, I have shown diodes 32 and 34 mounted at points B and D on the ring 31. These diodes are mounted on the outside of the rat race, connected directly to IF ground, as well as RF and LO ground, with each of these grounds being regarded as existing at 24. Both signals present a minima at the inputs, providing both isolation and a good match. Whereas the prior art utilized quarter wave stubs to provide the RF and LO ground, which limited bandwidth, I mount the diodes 32 and 34 between the hybrid and the ground plane, thus providing a very satisfactory RF and LO ground that is in intimate contact with the housing members 12 and 14. This ground plane also provides an excellent I.F ground.

Since both high frequency signals present a minima at E, that is the location where I prefer to place the thin high impedance line 36 for I.F. extraction, inasmuch as this arrangement allows the least amount of RF or LO to enter the I.F. circuitry. The I.F. signal occurs on the conductor of the 180° hybrid coupler 30.

The high impedance line 36 extends to the center point 38 of the rat race mixer 30, where the connection for IF extraction in accordance with this invention is to be made. For a 35 GHz mixer, the inner diameter of the hybrid is about 0.165 inch. The impedance of the line 36 should be at least 2 Zo, or in other words, about 100 ohms in accordance with the foregoing example.

Reference is now made to FIG. 4, where the center post 40 from a coaxial bulkhead connector, such as a SMA connector, is attached to the upper housing 14 and extends vertically through a teflon ring 44, although a ring of another suitable dielectric material could be substituted if such be preferred. Also illustrated in this figure are the hard dielectric 18, conductor 20, the ring portion of the rat race coupler 30, and the means providing good contact between the center post 40 and the stripline, so as to enable the IF to be extracted in a particularly advantageous manner. I may use a bellows 42 for making contact between the center post and the stripline, as illustrated in FIG. 4. FIG. 3 illustrates by dashed lines, the relationship of the bellows 42 to the high impedance line 36.

The bellows 42 is soldered to the bottom of the center post 40, such that excellent contact is made between the center post and the high impedance line 36 at or near the point 38 on the quartz substrate, due to the fact that the bellows is chosen to be of a length sufficient to form a desirable bit of pressure against the high impedance line 36. This pressure exerted by the bellows does not unduly stress the quartz substrate in a mechanical sense, nor does it create an undesirable electrical loading effect on the rat race.

It is to be realized that my novel IF extraction arrangement advantageously requires no solder connection to the substrate, and the connection may be repeatedly assembled and disassembled without damage to any of these components. It also should be noted to permit assembly of devices created in accordance with this invention without necessitating the use of skilled labor. This of course follows from the straightforward assembly techniques that my advantageous design make possible.

By way of example, bellows of 0.037" diameter are quite satisfactory, and they are commercially available.

Although not of particular consequence to my invention, the screw threads 46 shown in FIG. 4 on the upper metal member 48 are designed to receive a coaxial connector, such as a type SMA connector. These threads may be regarded as ground.

As should now be clear to those skilled in the art, I have designed a highly advantageous rat race mixer that is entirely surrounded by a ground plane, with the RF and LO relationships being such that the ring is at RF and LO potential. After accomplishing this, it then became necessary to make the surrounding ground plane also the ground for the I.F, and at the same time to be able to accomplish the extraction of the I.F. This was of course accomplished in accordance with this invention by placing the high impedance line at E on the ring portion 31 of the rat race, an RF and LO minima, with the bellows arrangement preferably being used to extract the I.F., as previously mentioned. By the use of the SMA connector, the IF is directed through the coaxial connector 46 to the preamplifier of a mixer or other I.F. circuitry.

It is apparent that the conductors 20 and 26 of the rat race must not be shorted to ground in any circuit in which a mixer is used. I therefore use a DC block or coupling capacitor in the LO and RF lines as required, such as shown at 28 in two locations on FIG. 1.

In my mixer, the rat race is at RF, LO and IF potential, and the ground plane 24 is ground for all three signals. This is in distinct contrast to the teachings of the prior art, where the rat race is typically at IF ground, and at RF and LO potential. This had the disadvantage of requiring quarter wave stubs or holes with grounding wires extending through the substrate to provide RF/LO ground. Since the stubs necessarily are at IF potential, the IF needed to be extracted from each stub and then recombined, typically by the use of jumper wires. This not only is more complicated than the instant design, but also, it usually placed a distinct limit on operating bandwidth.

By now it should be quite apparent that no quarter wave stubs are needed in my invention for RF or LO ground; that no holes through the substrate are necessary for IF ground; nor are any jumper wires needed for IF removal. Because of its compactness and low cost, my invention is entirely suitable for a wide range of applications.

I claim:

1. In a suspended stripline utilizing a substrate and having RF and LO signal inputs, and providing an IF signal output, a rat race mixer;

said rat race mixer being in the form of a ring that is entirely surrounded by a ground plane, located on the same side of said substrate as said ring, said ring having an outer part and a center, diode means on said outer part of said ring, connecting said ring to said ground plane at locations of RF signal and LO signal maxima, and means in the form of a high impedance lead at the center of said ring, at which the generated IF signal is extracted.

2. The rat race in suspended stripline as recited in claim 1 in which said ground plane surrounding said rat race is ground for all signals in the mixer, that is, for the IF, RF, and LO signals.

3. The rat race in suspended stripline as recited in claim 1 in which a bellows is in contact with said high impedance lead, said bellows being supported by the center post of a coaxial bulkhead connector equipped with a center post, by which the IF is extracted.

* * * * *